(12) United States Patent
Ham et al.

(10) Patent No.: US 7,429,519 B2
(45) Date of Patent: Sep. 30, 2008

(54) METHOD OF FORMING ISOLATION LAYER OF SEMICONDUCTOR DEVICE

(75) Inventors: Chul Young Ham, Guri-si (KR); Noh Yeal Kwak, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 7 days.

(21) Appl. No.: 11/614,084

(22) Filed: Dec. 21, 2006

(65) Prior Publication Data
US 2008/0124894 A1 May 29, 2008

(51) Int. Cl.
*H01L 21/76* (2006.01)
(52) U.S. Cl. .................. 438/433; 438/524; 438/525; 257/E21.551
(58) Field of Classification Search .......... 438/433, 438/524, 525
See application file for complete search history.

(56) References Cited

U.S. PATENT DOCUMENTS

| 5,904,538 | A  | * | 5/1999  | Son et al. ............. | 438/424 |
| 6,514,833 | B1 | * | 2/2003  | Ishida et al. ........... | 438/424 |
| 2002/0182826 | A1 | * | 12/2002 | Cheng et al. ........... | 438/433 |
| 2004/0266199 | A1 | * | 12/2004 | Lee ..................... | 438/705 |
| 2005/0124102 | A1 | * | 6/2005  | Wang et al. ........... | 438/197 |

FOREIGN PATENT DOCUMENTS

| JP | 2006-140239 | | 6/2006 |
| KR | 1020040105194 | A | 12/2004 |
| KR | 1020050002488 | A | 1/2005 |
| KR | 1020050071906 | A | 7/2005 |
| KR | 1020060076370 | A | 7/2006 |

* cited by examiner

*Primary Examiner*—Trung Dang
(74) *Attorney, Agent, or Firm*—Townsend and Townsend and Crew LLP

(57) ABSTRACT

A method of forming an isolation structure of a semiconductor device includes implanting dopants of a first type into a semiconductor substrate to form a doped region in the substrate. A mask layer is provided over the substrate and the doped region of the substrate. The mask layer is patterned to expose an isolation region of the substrate, the isolation region defining an active region, the isolation region and the active region being defined at least partly within the doped region. Dopants of a second type are implanted at an edge of the active region as defined by the isolation region. The isolation region of the semiconductor substrate is etched to form an isolation trench having a depth that extends below a depth of the doped region. Dopants of a third type are implanted on sidewalls of the trench in order to minimize the dopants of the second type provided on the sidewalls of the isolation trench from migrating away from the sidewalls. The trenches are filled with a dielectric layer to form an isolation structure.

20 Claims, 4 Drawing Sheets

METHOD OF FORMING ISOLATION LAYER OF SEMICONDUCTOR DEVICE

CROSS-REFERENCES TO RELATED APPLICATIONS

The present application claims priority to Korean patent application number 10-2006-091733, filed on Sep. 21, 2006, which is incorporated by reference in its entirety.

BACKGROUND OF THE INVENTION

The present invention relates to a method of forming a semiconductor device, and more particularly to a method of forming an isolation layer of a semiconductor device in which a fluorine (F) ion implantation process is performed in order to protect trench sides, prevent boron (B) migration and reduce leakage current.

In recent years, when constructing highly-integrated flash memory devices, an isolation layer is formed by a Self-Aligned Shallow Trench Isolation (SA-STI) scheme through which device structures can be formed conveniently, preventing damage to the tunnel oxide layer, and device characteristics can be obtained easily, thus improving device characteristics.

Generally, in NAND flash memory devices, after a trench is formed in a semiconductor substrate, an insulating layer is formed within the trench in order to gap-fill the trench. A High Density Plasma (HDP) oxide layer (i.e., an insulating layer) is largely used as a gap-fill material for gap-filling the trench.

However, as devices shrink, voids and/or seams are generated within the trench due to the HDP oxide layer. To solve the problem, polysilazane (PSZ) (i.e., a spin-on dielectric (SOD) material) is used when the trench is gap-filled.

However, if PSZ is used as the trench gap-fill material, the sides of the trench can become over stressed due to the tensile force caused by the thermal-mechanical properties of the material. The stress also causes the boron (B) dopant to migrate away from the trench, which results in the loss of boron (B) dopant implanted into the sides of the trench.

Furthermore, the boron (B) dopant is depleted from the sides of the trench because of the trench formation process. Accordingly, leakage current is increased in the HVNMOS transistor.

FIGS. 1A and 1B are views illustrating the flow of stress and boron (B) when a trench is filled with a HDP oxide layer or PSZ.

From FIG. 1A, it can be seen that tensile stress is generated in the trench when the trench is gap-filled with PSZ and the boron (B) moves away from the trench. From FIG. 1B, it can be seen that compressive stress is generated in the trench when the trench is gap-filled with the HDP oxide layer and the boron (B) moves towards the trench.

FIG. 2A is a graph showing the concentration of boron (B) verses the depth from the trench surface after an annealing process is performed. The concentration is measured using Secondary Ion Mass Spectroscopy (SIMS).

Referring to FIG. 2A, the curve "a" is when only arsenic (As) is implanted into the trench without an annealing process. The curve "b" is when a trench gap-fill process and an annealing process employing the HDP oxide layer are performed after an ion implantation process is performed on the trench. The curve "c" is when the trench gap-fill process and the annealing process employing PSZ are performed after the ion implantation process is performed on the trench. The curve "d" is when an annealing process for activating implanted ions is performed after the ion implantation process is performed to form a well. The X-axis corresponds to the depth, and the Y-axis corresponds to the concentration.

The curves "b" and "c" have the same process conditions, but differ in the materials used for gap-filling the trench. The curves "a" and "d" are provided to compare the curves "b" and "c". The curve "d" has a higher degree of boron (B) activation than the remaining curves because the annealing process is performed at a temperature of 100 degrees Celsius.

Comparing the curves "b" and "c", the curve b has a higher concentration of boron (B) on the trench surface than the curve "c". As the depth deepens, the trend is reversed, so that the curve "c" is higher in concentration than the curve "b". It can be seen that the curve "c" using PSZ has a higher concentration of boron (B) on the trench surface than the curve "b" using the HDP oxide layer.

FIG. 2B is a graph showing the concentration of boron (B) verses depth from the trench surface after an annealing process is performed. The concentration is measured using Spreading Resistance Probe (SRP).

Referring to FIG. 2B, the curve "e" is when a trench gap-fill process and an annealing process employing the HDP oxide layer are performed after an ion implantation process is performed on the trench. The curve "f" is when the trench gap-fill process and the annealing process employing PSZ are performed after the ion implantation process is performed on the trench. The curve "g" is when an annealing process for activating implanted ions is performed after the ion implantation process is performed to form a well.

Accordingly, it can be seen that the concentration of boron (B) on the trench surface is higher in the curve "e" using HDP than in the curve "f" using the PSZ oxide layer.

It can also be seen that the graph of FIG. 2B shows the concentration change of boron (B) more clearly compared with the graph of FIG. 2A, and has a similar result as that of FIG. 2A.

BRIEF SUMMARY OF THE INVENTION

Embodiments of the present invention are directed to a method of forming an isolation layer of a semiconductor device, in which a fluorine (F) ion implantation process is performed in order to protect trench sides, prevent boron (B) migration and reduce leakage current.

In one embodiment, a method of forming an isolation layer of a semiconductor device comprises the steps of; performing a first ion implantation process on the inside of a semiconductor substrate in order to control a threshold voltage, forming a hard mask layer through which an isolation region is exposed over the semiconductor substrate, etching the isolation region of the semiconductor substrate, thus forming trenches, performing a second ion implantation process on sidewalls of the trenches in order to prevent an impurity implanted so as to control the threshold voltage from diffusing; and forming an isolation layer over the isolation region, thus gap-filling the trenches.

Before the first ion implantation process is performed, the method further includes the step of performing a TN-well ion implantation process and a p-well ion implantation process on the inside of the semiconductor substrate in order to form a TN-well junction and a p-well junction.

A lamination structure of a buffer oxide layer and a nitride layer are formed under the hard mask layer.

A lamination structure of a tunnel oxide layer and a polysilicon layer are formed under the buffer oxide layer.

After the hard mask layer is formed, the method further includes the step of performing a third ion implantation process in order to implant a 3-valence impurity into edges of an active region of the semiconductor substrate.

The 3-valence impurity may include boron (B).

The third ion implantation process may be performed by implanting the 3-valence impurity at a tilt angle.

The third ion implantation process may be performed by implanting boron (B) with ion implantation energy of 5 to 50 KeV and a dose of 1E11 ion/cm² to 1E14 ion/cm².

The third ion implantation process may be performed by implanting the boron (B) at an angle of 3 to 30 degrees while rotating the semiconductor substrate every 90 degrees.

The second ion implantation process may be performed using a fluorine (F)-based insert gas.

The second ion implantation process may be performed by implanting the fluorine (F) with ion implantation energy of 5 to 50 KeV and a dose of 1E11 ion/cm² to 1E14 ion/cm².

The second ion implantation process may be performed by implanting the fluorine (F) at an angle of 3 to 30 degrees while rotating the semiconductor substrate every 90 degrees.

The step of forming the isolation layer includes the steps of forming a spin-on dielectric (SOD) layer over the entire surface in such a way to gap-fill the trenches, performing a thermal treatment process on the SOD layer, and performing an etch process so that the thermally treated SOD layer remains only in the isolation region.

The SOD layer may be formed from a polysilazane (PSZ) material.

The thermal treatment process may be performed in a temperature range of 100 to 1000 degrees Celsius by using $H_2$ or a mixed gas of $N_2$ and $H_2$.

In one embodiment, a method of forming an isolation structure of a semiconductor device includes implanting dopants of a first type into a semiconductor substrate to form a doped region in the substrate. A mask layer is provided over the substrate and the doped region of the substrate. The mask layer is patterned to expose an isolation region of the substrate, the isolation region defining an active region, the isolation region and the active region being defined at least partly within the doped region. Dopants of a second type are implanted at an edge of the active region as defined by the isolation region. The isolation region of the semiconductor substrate is etched to form an isolation trench having a depth that extends below a depth of the doped region. Dopants of a third type are implanted on sidewalls of the trench in order to minimize the dopants of the second type provided on the sidewalls of the isolation trench from migrating away from the sidewalls. The trenches are filled with a dielectric layer to form an isolation structure. The dopants of the first type include boron, the dopants of the second type include boron, and the dopants of the third type include fluorine, and wherein the dielectric layer includes polysilazane (PSZ) material.

DESCRIPTION OF SPECIFIC EMBODIMENTS

Figure 1A:
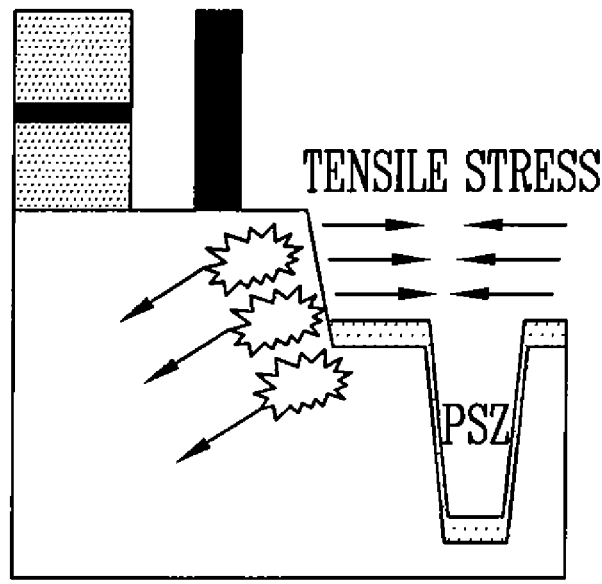
FIGS. 1A and 1B are views illustrating the flow of stress and boron (B) when a trench is filled with a HDP oxide layer or PSZ.
Figure 1B:
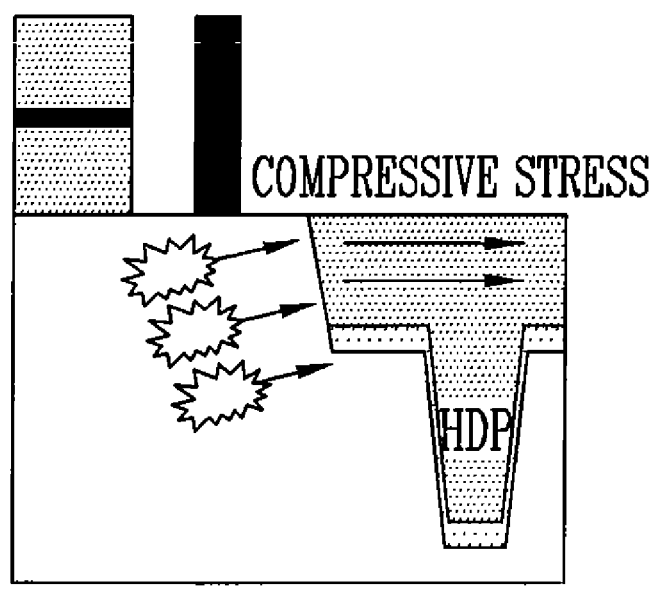
Figure 2A:
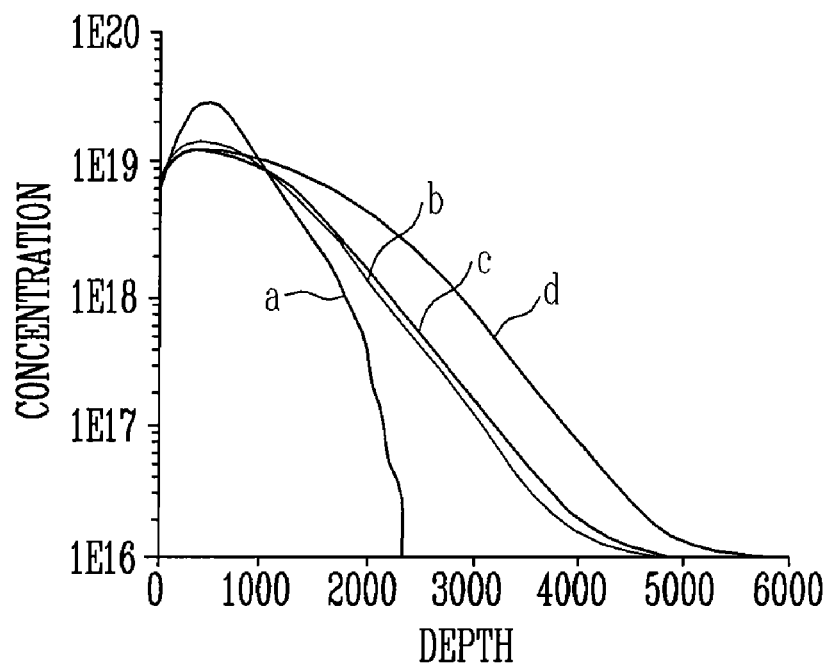
FIG. 2A is a graph showing the concentration of boron (B) verses the depth from the trench surface using Secondary Ion Mass Spectroscopy (SIMS) after an annealing process is performed.
Figure 2B:
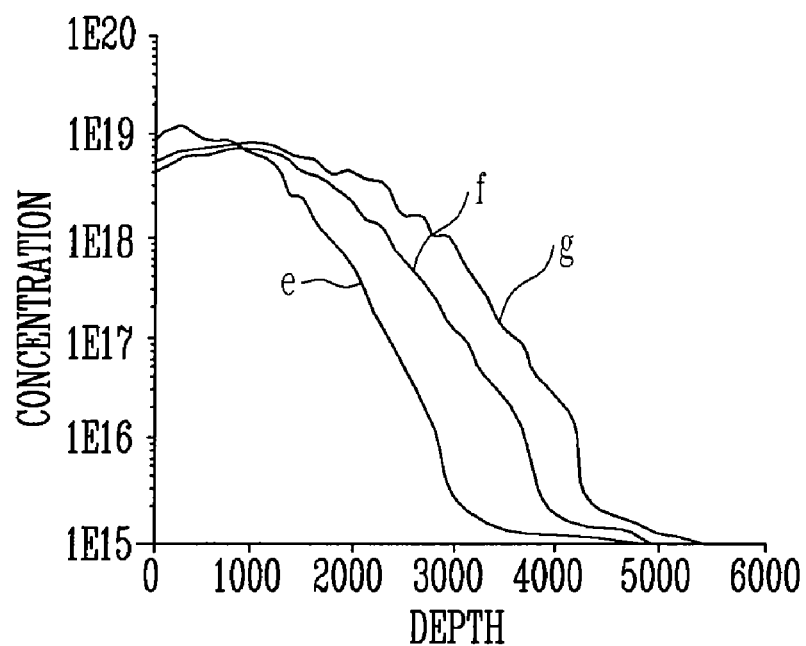
FIG. 2B is a graph showing the concentration of boron (B) verses the depth from the trench surface using Spreading Resistance Probe (SRP) after an annealing process is performed.
Figure 3A:
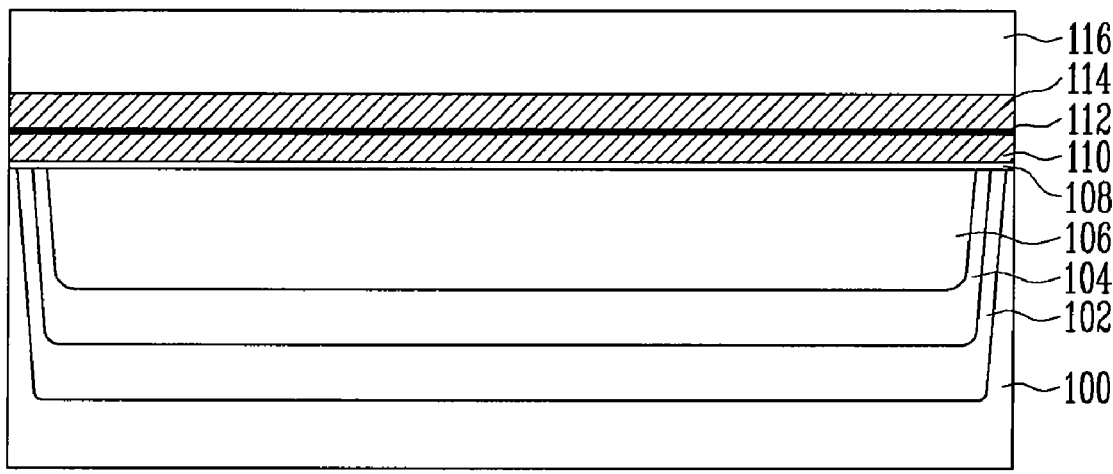
FIGS. 3A to 3D are cross-sectional views for illustrating a method of forming an isolation layer of a semiconductor device according to an embodiment of the present invention.

Referring to FIG. 3A, a TN-well ion implantation process and a p-well ion implantation process are performed on a p-type semiconductor substrate 100, forming a TN-well junction 102 and a p-well junction 104 in the p-type semiconductor substrate 100. In order to form a thin channel junction on the surface of the semiconductor substrate 100, the ion implantation process is performed with an ion implantation energy of 5 to 50 KeV and a dose of 1E11 ion/cm² to 1E14 ion/cm² by using $BF^2$, a dopant with a relatively high mass. To maximize ion collision of the dopant at the time of ion implantation, a tilted ion implantation of 3 to 45 degrees is used.

An ion implantation process for controlling a cell Vt employing a p-type dopant ion is performed to form a cell Vt junction 106. The cell Vt control ion implantation process is performed with an ion implantation energy of 5 to 50 KeV and a dose of 1E11 ion/cm² to 1E14 ion/cm² by using $B^{11}$, a dopant with a low mass. During the cell Vt control ion implantation process, a tilted ion implantation of 1 to 50 degrees is performed so as to prohibit channeling of the dopant.

A tunnel oxide layer 108, a polysilicon layer 110 for a floating gate, a buffer oxide layer 112, a nitride layer 114 and a hard mask layer 116 are sequentially formed over the semiconductor substrate 100.

Figure 3B:
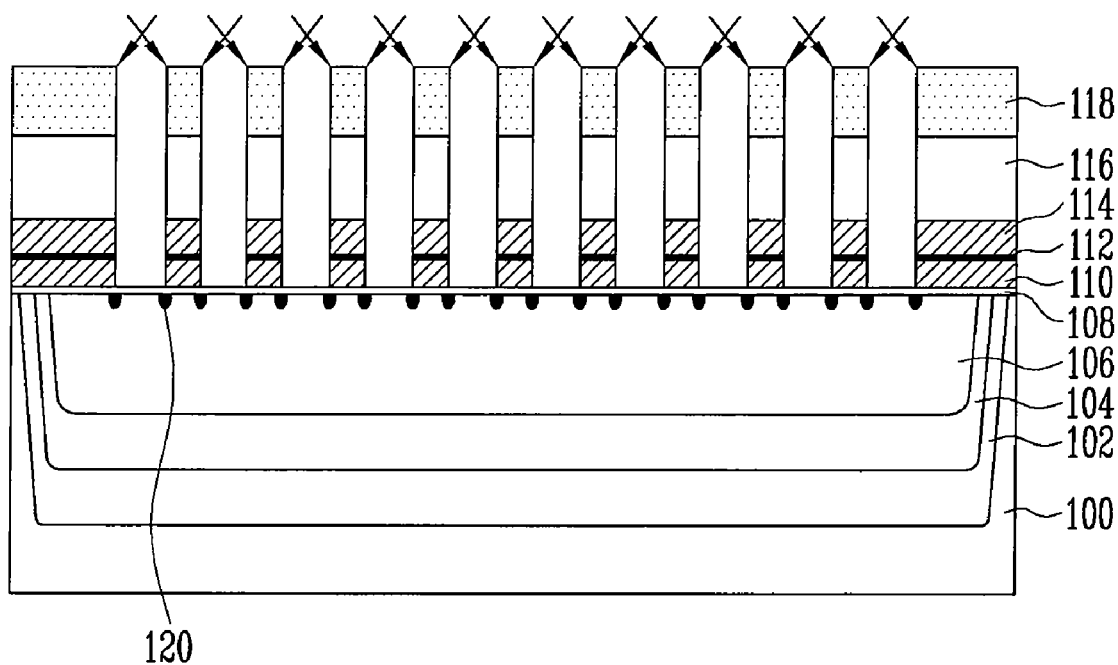

Referring to FIG. 3B, a photoresist pattern 118 is formed over the hard mask layer 116. The photoresist pattern 118 is then used as a mask to etch the hard mask layer 116, the nitride layer 114, the buffer oxide layer 112 and the polysilicon layer 110.

In order to reduce the leakage current of NMOS transistors, an ion implantation process is performed to form boron (B) junctions 120 so that boron (B) of a 3-valence impurity is implanted into the edges of the active region of the semiconductor substrate 100. The boron (B) ion implantation process is performed by implanting boron (B) with ion implantation energy of 5 to 50 KeV and a dose of 1E11 ion/cm² to 1E14 ion/cm², and implanting boron (B) at an angle of 3 to 30 degrees while rotating the semiconductor substrate 100 90 degrees at a time.

In this case, point defects are generated on the sides of the hard mask layer 116, the nitride layer 114, the buffer oxide layer 112 and the polysilicon layer 110, which have been etched, due to the boron (B) ion implantation process.

Figure 3C:
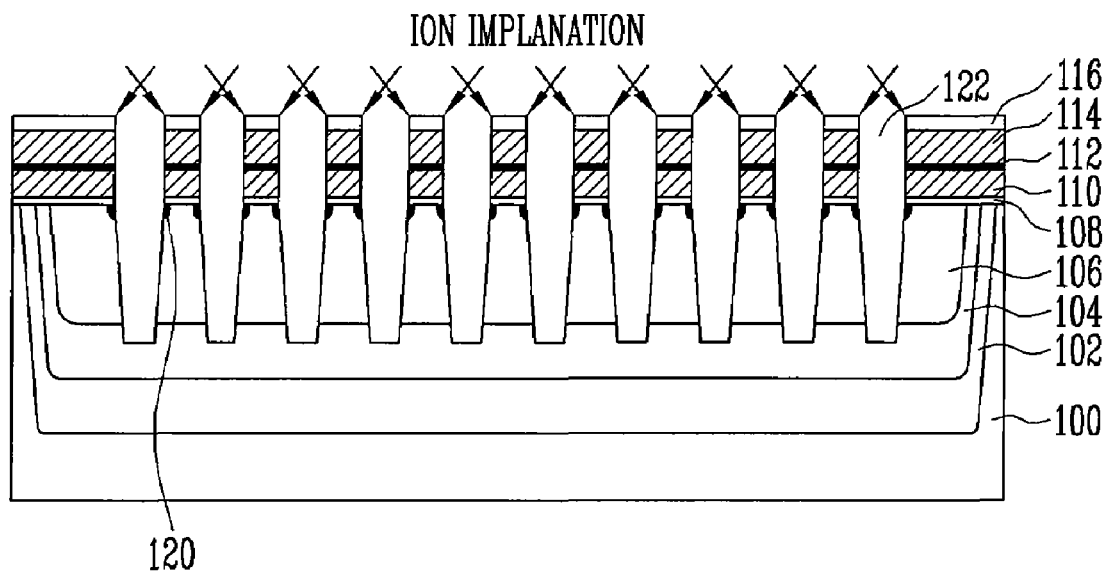

Referring to FIG. 3C, after the photoresist pattern 118 is removed, the tunnel oxide layer 108 is etched and the semiconductor substrate 100 is partially etched using the hard mask layer 116 as a mask, thus forming trenches 122.

In order to prevent the loss of boron (B) due to a high voltage as in the case of a high-voltage in-put transistor, the trench etch process, as described above, is carried out by performing a first etch process of sequentially etching the hard mask layer 116, the nitride layer 114, the buffer oxide layer 112 and the polysilicon layer 110, and a second etch process of etching the tunnel oxide layer 108 and the semiconductor substrate 100.

However, due to this, etch damage to the channel junction region becomes more profound. Accordingly, the concentration of boron (B) on the sides of the trenches 122 is further reduced. Another ion implantation process is performed using a fluorine (F)-based insert gas. The fluorine (F)-based ion implantation process is performed by implanting fluorine (F) with an ion implantation energy of 5 to 50 KeV and a dose of 1E11 ion/cm² to 1E14 ion/cm², and implanting fluorine (F) at an angle of 3 to 30 degrees while the semiconductor substrate 100 is rotated 90 degrees at a time.

Figure 3D:
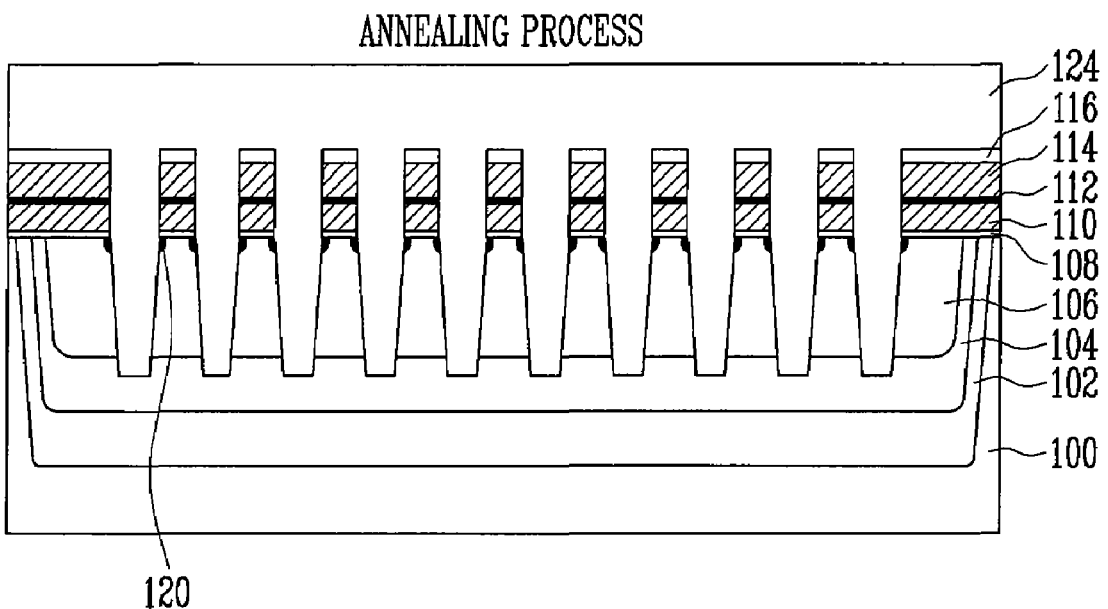

Referring to FIG. 3D, in order to gap-fill the trenches 122, a SOD layer 124 is formed on the entire surface. The SOD layer 124 is formed from a PSZ material. In order to outgas $H_2$ remaining within the SOD layer 124 and activate the fluorine (F), a thermal treatment process is performed. The thermal treatment process may be performed in a temperature range of 100 to 1000 degrees Celsius by using $H_2$ or a mixed gas of $N_2$ and $H_2$.

Hydrogen ($H_2$), which causes tensile stress of the SOD layer 124, chemically reacts with fluorine (F) through the thermal treatment process, thereby preventing the loss of boron (B). Fluorine (F) reacts more easily with hydrogen ($H_2$) between hydrogen ($H_2$) and boron (B). So if fluorine (F) is in substrate, boron (B) easily be activated without disturbing hydrogen ($H_2$) of PSZ. In the embodiment of the invention, using fluorine (F) gettering layer prevents the reaction between hydrogen ($H_2$) in PSZ and boron (B). It is therefore possible to prevent the loss of boron (B) using a subsequent high-temperature thermal treatment process and to remove $H_2$ remaining within the SOD layer 124.

Though not shown in the drawings, an etch process is performed such that the thermally treated SOD layer 124 remains within only the trenches 122.

Embodiments of the present invention have one or more the following advantages.

First, the fluorine (F) ion implantation process is performed on the insides of the trenches. It is thus possible to reduce stress on the sides of the trenches and minimize the migration of boron (B) and reduce leakage current and reduce the loss of boron (B) on the sides of the trenches.

Second, point defects that occur during the boron (B) ion implantation process are selectively removed by performing the fluorine (F) ion implantation process on the insides of the trenches. Accordingly, stable transistors can be fabricated due to a subsequent annealing process.

The above embodiments of the present invention are illustrative and not limitative. For example, the invention may be implemented in volatile memory devices, non-volatile memory devices, or other types of semiconductor devices. Various alternatives and equivalents are possible. Other additions, subtractions, or modifications are obvious in view of the present disclosure and are intended to fall within the scope of the appended claims.

What is claimed is:

1. A method of forming an isolation structure of a semiconductor device, the method comprising:
    performing a first ion implantation process on a semiconductor substrate in order to control a threshold voltage, a first impurity being provided within the substrate;
    forming a hard mask layer through which an isolation region is exposed over the semiconductor substrate;
    etching the isolation region of the semiconductor substrate to form trenches;
    performing a second ion implantation process to provide a second impurity on sidewalls of the trenches in order to minimize the first impurity from diffusing away sidewalls of the trenches; and
    filling the trenches with a dielectric layer to form isolation structures.

2. The method of claim 1, further comprising: before the first ion implantation process is performed, performing a TN-well ion implantation process and a p-well implantation process on the semiconductor substrate in order to form a TN-well junction and a p-well junction.

3. The method of claim 1, wherein a buffer oxide layer and a nitride layer are provided below the hard mask layer.

4. The method of claim 3, wherein a tunnel oxide layer and a polysilicon layer are provided below the buffer oxide layer.

5. The method of claim 1, further comprising:
    after the hard mask layer is formed, performing a third ion implantation process in order to implant a 3-valence impurity into edges of an active region of the semiconductor substrate, the third ion implantation process being performed before the second ion implantation process.

6. The method of claim 5, wherein the 3-valence impurity includes boron (B).

7. The method of claim 5, wherein the third ion implantation process is performed by implanting the 3-valence impurity at a tilt angle.

8. The method of claim 6, wherein the third ion implantation process is performed by implanting boron (B) with an ion implantation energy of 5 to 50 KeV and a dose of 1E11 ion/cm² to 1E14 ion/cm².

9. The method of claim 6, wherein the third ion implantation process is performed by implanting the boron (B) at an angle of 3 to 30 degrees while rotating the semiconductor substrate 90 degrees at a time.

10. The method of claim 1, wherein the second ion implantation process is performed using a fluorine (F)-based insert gas.

11. The method of claim 10, wherein the second ion implantation process is performed by implanting the fluorine (F) with an ion implantation energy of 5 to 50 KeV and a dose of 1E11 ion/cm² to 1E14 ion/cm².

12. The method of claim 10, wherein the second ion implantation process is performed by implanting the fluorine (F) at an angle of 3 to 30 degrees while rotating the semiconductor substrate 90 degrees at a time.

13. The method of claim 1, wherein the filling step involves forming a spin-on dielectric (SOD) layer over the substrate to gap-fill the trenches, and
    wherein the method further comprises;
    performing a thermal treatment process on the SOD layer; and
    etching the thermally treated SOD layer, so that the SOD layer remains primarily in the isolation region.

14. The method of claim 13, wherein the SOD layer is formed from a polysilazane (PSZ) material.

15. The method of claim 13, wherein the thermal treatment process is performed in a temperature range of 100 to 1000 degrees Celsius by using $H_2$.

16. The method of claim 13, wherein the thermal treatment process is performed using $N_2$ and $H_2$.

17. A method of forming an isolation structure of a semiconductor device, the method comprising:
    implanting dopants of a first type into a semiconductor substrate to form a doped region in the substrate;
    providing a mask layer over the substrate and the doped region of the substrate;
    patterning the mask layer to expose an isolation region of the substrate, the isolation region defining an active region, the isolation region and the active region being defined at least partly within the doped region;
    implanting dopants of a second type at an edge of the active region as defined by the isolation region;
    etching the isolation region of the semiconductor substrate to form an isolation trench having a depth that extends below a depth of the doped region;

implanting dopants of a third type on sidewalls of the trench in order to minimize the dopants of the second type provided on the sidewalls of the isolation trench from migrating away from the sidewalls; and filling the trenches with a dielectric layer to form an isolation structure.

18. The method of claim 17, wherein the dopants of the first type include boron, the dopants of the second type include boron, and the dopants of the third type include fluorine, and wherein the dielectric layer includes polysilazane (PSZ) material.

19. A method of forming an isolation structure of a semiconductor device, the method comprising:

implanting dopants of a first type into a semiconductor substrate to form a doped region in the substrate;

providing a mask layer over the substrate and the doped region of the substrate;

patterning the mask layer to define to expose an isolation region of the substrate, the isolation region defining an active region;

implanting dopants of a second type through an opening defined by the patterning of the mask layer;

etching the isolation region of the semiconductor substrate to form an isolation trench having a depth that extends below a depth of the doped region;

implanting dopants of a third type on sidewalls of the trench in order to minimize the dopants of the second type provided on the sidewalls of the isolation trench from migrating away from the sidewalls; and filling the trenches with a dielectric layer to form an isolation structure, the dielectric layer including polysilazane (PSZ) material.

20. The method of claim 19, wherein the dopants of the third type include fluorine, the method further comprising:

thermally treating the dielectric layer, so that hydrogen residues in the dielectric layer are caused to react with the fluorine and removed from the dielectric layer.

* * * * *

UNITED STATES PATENT AND TRADEMARK OFFICE
CERTIFICATE OF CORRECTION

| | | |
|---|---|---|
| PATENT NO. | : 7,429,519 B2 | Page 1 of 1 |
| APPLICATION NO. | : 11/614084 | |
| DATED | : September 30, 2008 | |
| INVENTOR(S) | : Chul Young Ham and Noh Yeal Kwak | |

It is certified that error appears in the above-identified patent and that said Letters Patent is hereby corrected as shown below:

Please insert the following on the front page of the patent:

Title Page Item (30) should read
--(30)    Foreign Application Priority Data
Sep. 21, 2006    (KR) ........................ 10-2006-0091733--

Signed and Sealed this

Second Day of June, 2009

JOHN DOLL
*Acting Director of the United States Patent and Trademark Office*